US008922306B2

(12) United States Patent
Clark, Jr. et al.

(10) Patent No.: US 8,922,306 B2
(45) Date of Patent: Dec. 30, 2014

(54) REDUCED SIZE BIAS TEE

(75) Inventors: Charles F. Clark, Jr., Beaverton, OR (US); James D. Pileggi, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 238 days.

(21) Appl. No.: 13/534,636

(22) Filed: Jun. 27, 2012

(65) Prior Publication Data

US 2014/0002213 A1 Jan. 2, 2014

(51) Int. Cl.
*H01P 3/08* (2006.01)
*H01P 5/20* (2006.01)
*H05K 7/02* (2006.01)

(52) U.S. Cl.
USPC .......................... 333/246; 333/24 R; 361/760

(58) Field of Classification Search
CPC ................ H01P 3/08; H01P 5/19; H01P 5/20
USPC ....... 333/24 R, 245, 246, 254, 260, 117, 121; 361/748, 760, 782
See application file for complete search history.

(56) References Cited

U.S. PATENT DOCUMENTS 5,101,322 A * 3/1992 Ghaem et al. ................. 361/715
7,145,782 B2 * 12/2006 Searls et al. .................. 361/780
2009/0237177 A1 9/2009 Ma

FOREIGN PATENT DOCUMENTS

GB 2168542 A 6/1986

OTHER PUBLICATIONS

Davidovitz, Marat, "A Compact Planar Magic-T Junction with Aperture-Coupled Difference Port", IEEE Microwave and Guided Wave Letters, IEEE Inc, New York, US, vol. 7, No. 8, Aug. 1, 1997, 2 pages.
Aikawa et al., Masayoshi, "A New MIC Magic-T Using Coupled Slot Lines", IEEE Transactions on Microwave Theory and Techniques, IEEE Service Center, Piscataway, NJ, US, vol. MTT-28, No. 6, Jun. 1, 1980, 6 pages.
European Search Report from EP Application No. 13174128.2, dated Oct. 28, 2013, 9 pages.

* cited by examiner

*Primary Examiner* — Dean O Takaoka
(74) *Attorney, Agent, or Firm* — Thomas F. Lenihan; Marger Johnson & McCollom PC

(57) ABSTRACT

A system can include a first radio frequency (RF) port, a second RF port electrically coupled with the first RF port, a direct current (DC) port, and a bias tee incorporated into a substrate. The bias tee can include multiple capacitors that are each integrated as a catch pad with a layer of the substrate. The bias tee can also include an inductor at least partially integrated with a layer of the substrate.

20 Claims, 7 Drawing Sheets

REDUCED SIZE BIAS TEE

BACKGROUND

Bias tees are generally used to supply direct current (DC) voltages or currents to radio frequency (RF) circuits or devices, such as field-effect transistors (FETs) that are typically used in amplifiers, for example. When incorporating a bias tee into a circuit or system, a designer must pay particular attention to a number of certain properties, such as RF bandwidth, insertion loss, mismatch at the two RF ports, and the maximum DC current, for example.

FIG. 1 illustrates a first example 100 of a current system implementing a typical bias tee. The system in this example 100 includes an RF/DC port 106, an RF port 102, a DC port 130, a first tee 110, and a second tee 124. Either or both of the first and second tees 110 and 124, respectively, may be a discrete component or simply a point at which multiple lines or wires connect.

In the example 100, the bias tee is implemented by way of a first capacitor 104 situated between the tee 110 and RF port 102, an inductor 122 situated between the first tee 110 and the second tee 124, and a second capacitor 132 coupled with the DC port 130. An RF signal incident to the RF/DC port 106 is delivered to the RF port 102, while a DC signal is injected at the DC port 130.

FIG. 2 illustrates a second example 200 of a current system implementing a typical bias tee. The system in this example 200 implements a bias tee by way of a capacitive feedthru pin 218 passing through a layer 202, e.g., a substrate, a first wire 214 electrically coupling the capacitive feedthru pin 218 to a capacitor 213 on the layer 202, and a second wire 212 electrically coupling the capacitor 213 to an RF microstrip 204 on the layer 202. A bias tee such as the one implemented in this example 200 is typically large, often requiring at least ⅜" of space on the layer 202. Also, the capacitive feedthru pin 218 is typically at least ¼" in diameter.

Bias tees are often used to place a DC or other low frequency signal on a RF/microwave signal without otherwise disturbing the microwave signal. This has usually accomplished by way of a coil of wire or, for higher frequencies, a very long bond wire. However, coils are plagued with parasitics that limit performance.

Bond wires tend to be long, thus requiring special cavities to contain them. In current systems and devices, bond wires cannot be folded to reduce space. Current systems generally require extremely long bond wires and special cavities to contain them. These bond wires are attached to metal-insulator-metal (MIM) capacitors, which typically requires epoxy to secure them thereto, as well as additional bond wires.

Accordingly, a need remains for bias tees that have a reduced size without reducing or otherwise limiting performance

SUMMARY

Embodiments of the disclosed technology generally allow for an inductance to be folded, thus reducing the space required therefor. Since part of the inductance is thus placed on the substrate metalization, the consistency of the resulting product is improved. Also, effective wide bandwidth capacitors may be built into different layers of the substrate to reduce the number of assembly components.

A bias tee in accordance with the disclosed technology generally requires only one bond wire, and the capacitor and additional filtering may be incorporated into the substrate. The net result is thus a smaller bias tee having associated therewith a more efficient assembly process.

DETAILED DESCRIPTION

Embodiments of the disclosed technology generally include reduced size bias tees, such as would be suitable to be implemented in any of a number of different circuits and systems. These and other features and embodiments of the present invention proceed with reference to each of the figures.

Figure 1:
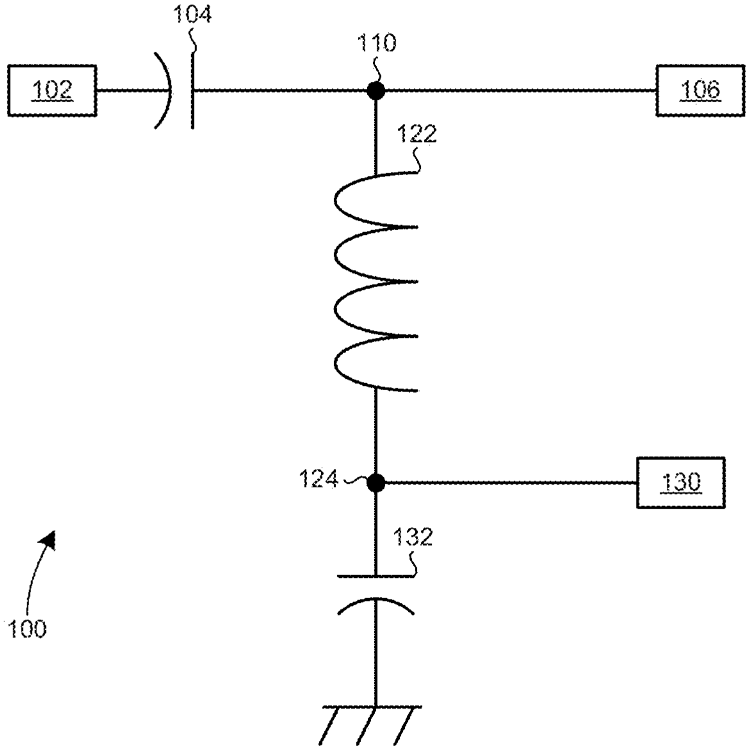
FIG. 1 PRIOR ART
FIG. 1 illustrates a first example of a current circuit or system implementing a typical bias tee.
Figure 2:
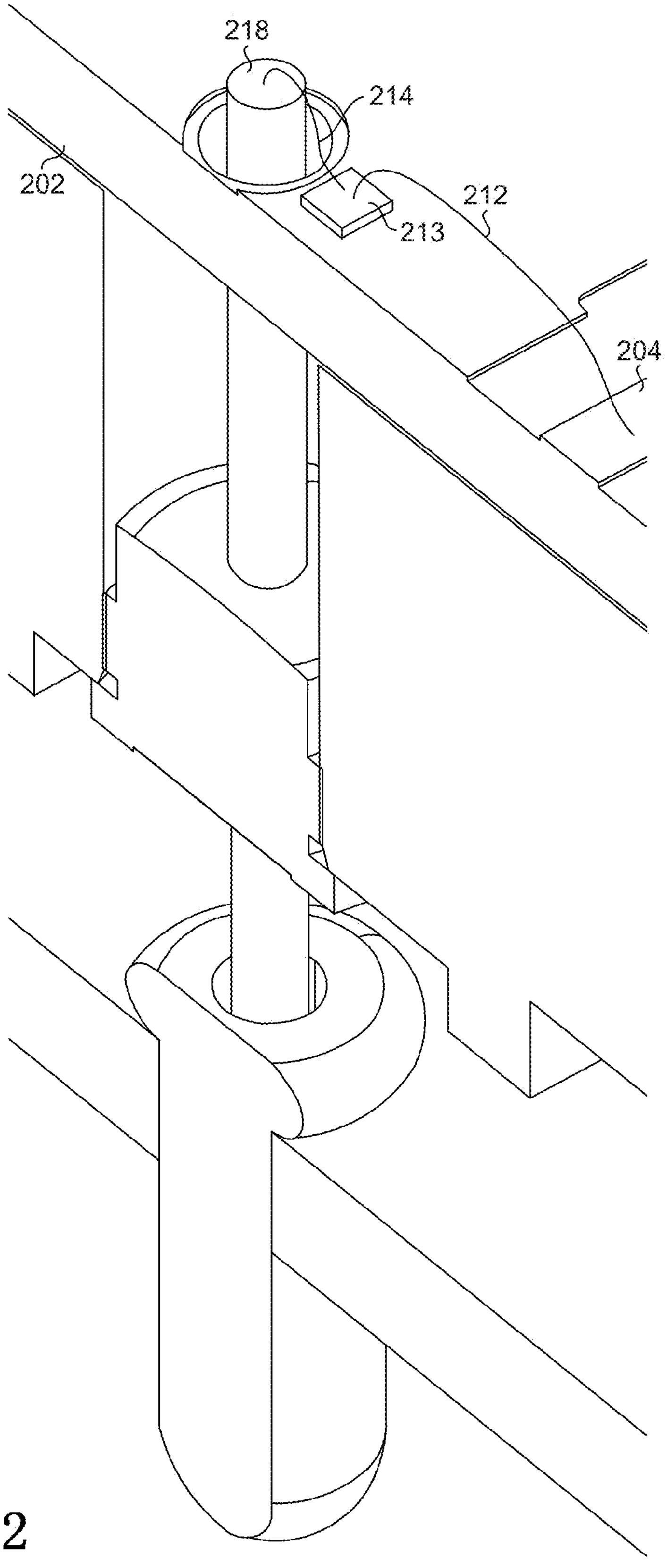
FIG. 2 illustrates a second example of a current circuit or system implementing a typical bias tee.
Figure 3:
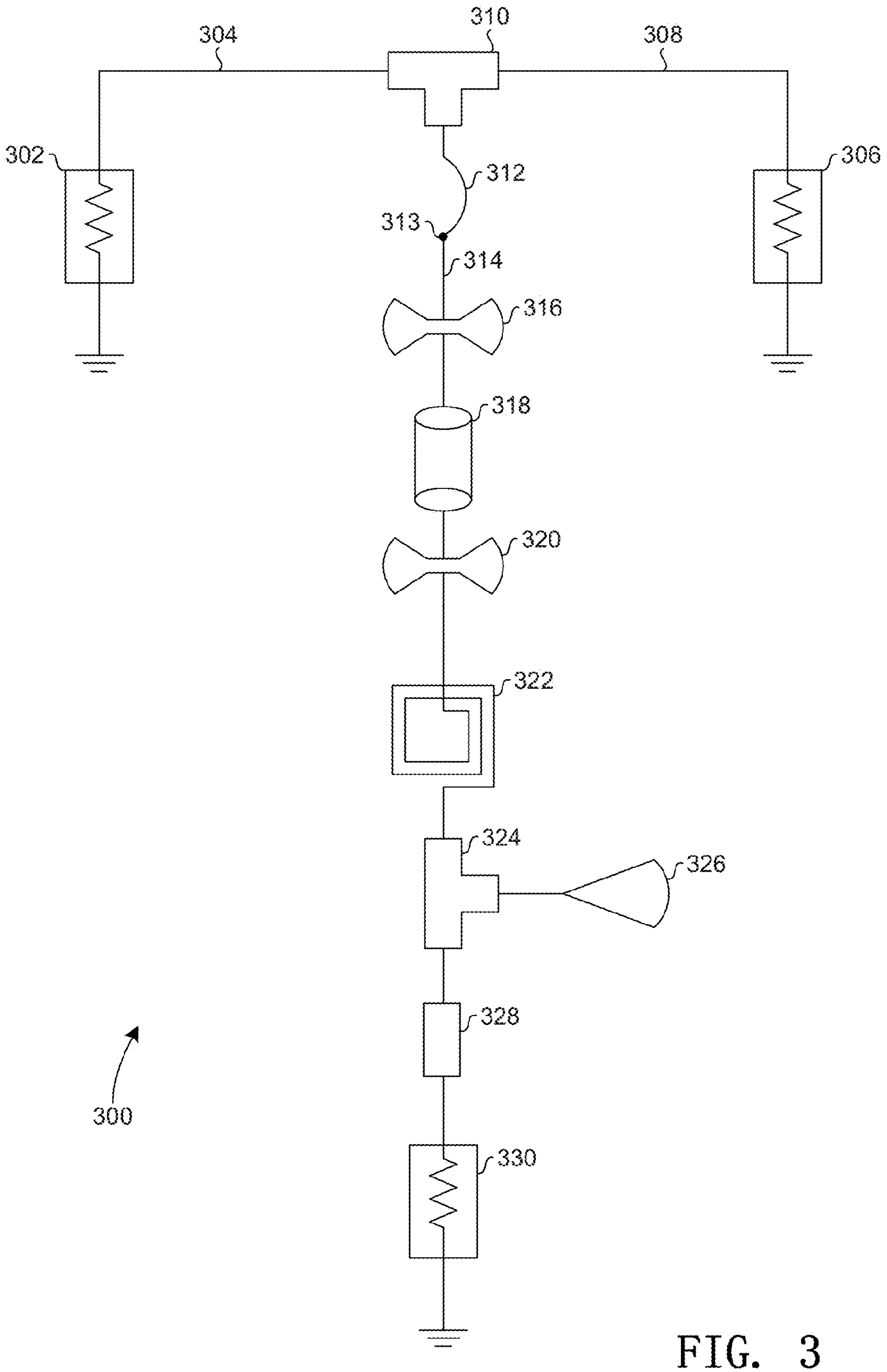
FIG. 3 is a functional diagram illustrating an example of a circuit or system implementing a bias tee in accordance with certain embodiments of the disclosed technology.

FIG. 3 is a functional diagram illustrating an example of a system 300 implementing a bias tee in accordance with certain embodiments of the disclosed technology. The system 300 includes a first RF port ("RF OUT") 302, a second RF port ("RF IN") 306, and a DC port 330. A first line 304 electrically couples the first RF port 302 with a first tee 310, and a second line 308 electrically couples the second RF port 306 with the first tee 310. The first tee 310 may be a discrete component or simply a point at which the first and second line 304 and 308, respectively, connect.

Either or both of the first and second lines 304 and 308, respectively, may be implemented as an RF microstrip. In certain embodiments, a single RF microstrip includes both lines 304 and 308. Alternatively or in addition thereto, either or both of the lines 304 and 308 may be implemented as wires or other suitable component or device for electrically coupling the corresponding RF port with the first tee 310.

In the example, a bias tee is implemented by way of a first catch pad 316, a connecting pin 318, a second catch pad 320, an inductor 322, and a radial stub 326. The first tee 310 is electrically coupled with the first catch pad 316 by way of a first wire 312, a second wire 314, and a connection point 313 therebetween. Either or both of the first and second wires 312 and 314, respectively, may be implemented as a wire bond. Alternatively or in addition thereto, either or both of the wires 312 and 314 may be at least substantially co-planar with or otherwise integrated on or with a surface of the underlying substrate, e.g., layer, at or on which the first catch pad 316 is situated.

The connecting pin 318 may be implemented as any suitable component or mechanism for electrically coupling the first catch pad 316 to the second catch pad 320, which may be situated on or at a surface of the substrate opposite that associated with the first catch pad 316. The connecting pin 318 typically is a via in the layer or substrate. In alternative embodiments, the connecting pin 318 may couple the first and second catch pads 316 and 320, respectively, independent of a via.

The inductor 322 serves to electrically couple the second catch pad 320 with a second tee 324. As with the first tee, 310, the second tee 324 may be a discrete component or simply a point at which multiple lines may connect. The inductor 322 may be situated on or at the same surface of the substrate, e.g., layer, as the second catch pad 320.

The second tee 324 is electrically coupled with the radial stub 326, and also with the DC port 330 by way of a line 328. In certain embodiments, either or both of the radial stub 326 and DC port 330 may be situated at least substantially at or on the same surface of the layer or substrate associated with the inductor 322.

Figure 4:
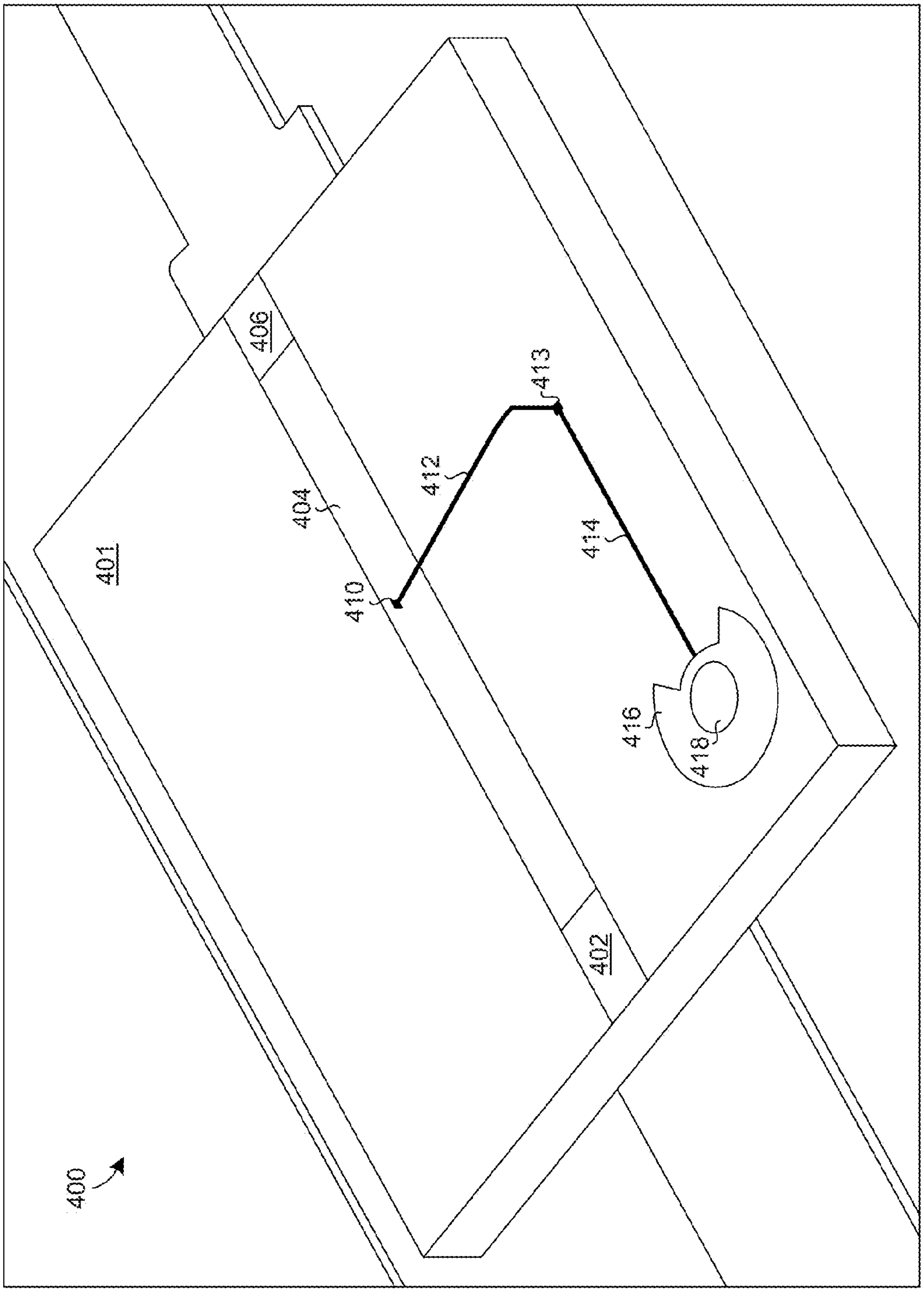
FIG. 4 illustrates a first view of an example of a circuit or system implementing a bias tee in accordance with certain embodiments of the disclosed technology.

FIG. 4 illustrates a first view 400 of an example of a circuit or system implementing a bias tee in accordance with certain embodiments of the disclosed technology. This view 400 illustrates a top layer or surface 401 of a substrate, an RF microstrip 404, such as the first and second lines 304 and 308, respectively, of FIG. 3, that is electrically coupled with a first catch pad 416, such as the first catch pad 316 of FIG. 3, by way of a first tee 410, a first wire 412, a second wire 414, and a connection point 413, such as the first tee 310, first wire 312, second wire 314, and connection point 313 of FIG. 3, respectively. The first catch pad 416 may be implemented as a radial stub, e.g., a broadband short circuit, at least partially integrated with the top layer 401.

The example also includes a first RF port 402 and a second RF port 406, such as the first and second RF ports 302 and 306, respectively, of FIG. 3. The second wire 414 represents part of the inductor and is generally of a high impedance. In certain embodiments, the second wire 414 may have the ground plane removed underneath it to increase the line impedance.

Either or both of the first and second wires 412 and 414, respectively, may be implemented as a bond wire. Either or both of the wires 412 and 414 may be at least substantially co-planar with or otherwise integrated on or with the same surface of the underlying substrate, e.g., layer, at or on which the first catch pad 416 is situated, e.g., the top layer 401. A connecting pin 418 serves to electrically couple the first catch 416 with a second catch pad, described below with regard to FIG. 6. A low frequency signal may thus pass through the connecting pin 418, e.g., through a via in the substrate. Either or both of the catch pads may be or include a capacitor.

Figure 5:
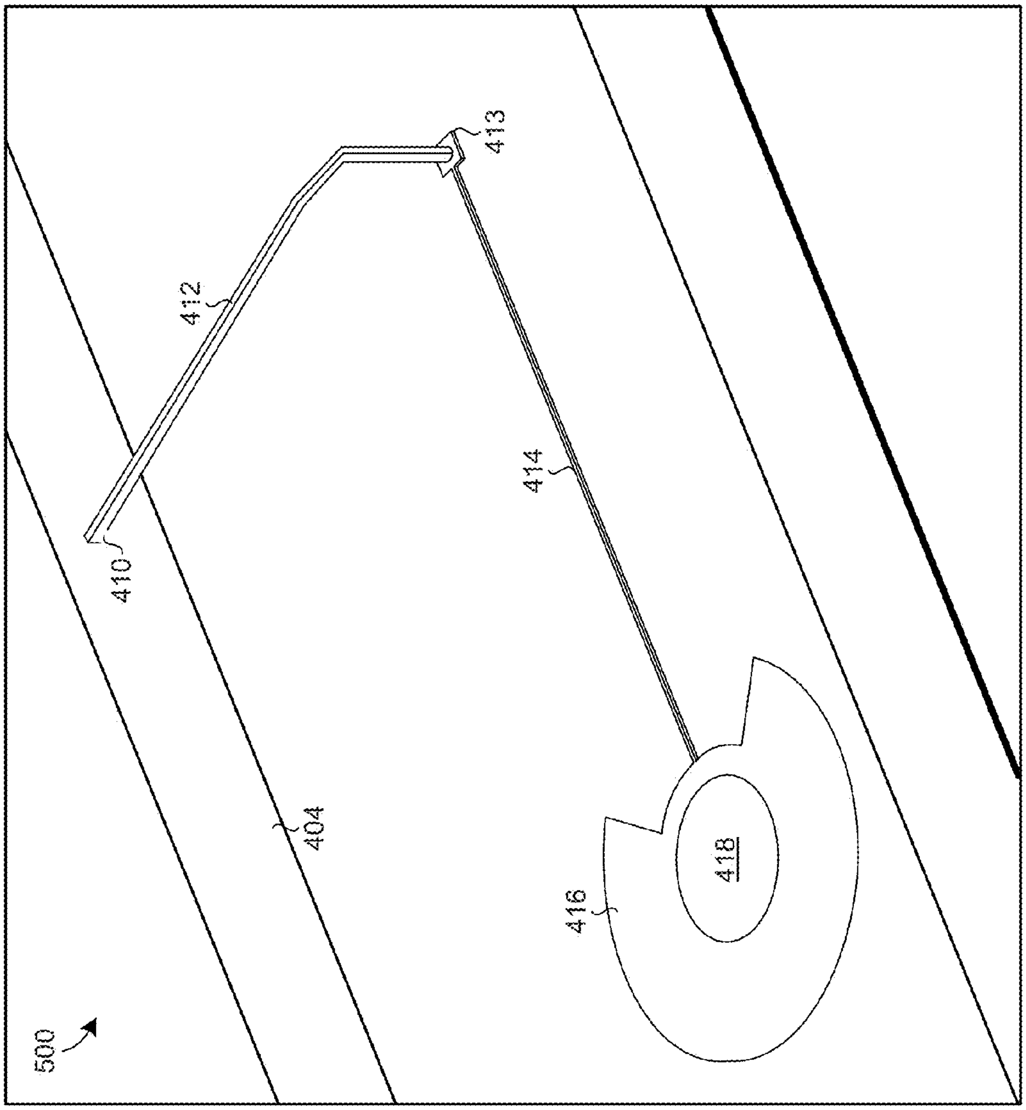
FIG. 5 illustrates a second view of the example circuit or system illustrated in FIG. 4.

FIG. 5 illustrates a second, more detailed view 500 of the example circuit or system illustrated in FIG. 4. In this view 500, the first wire 412 is a wire bond connected to the second wire by way of the connection point 413 and to the RF microstrip 404 by way of the first tee 410. The second wire 414 is at least substantially co-planar with and integrated on the same surface of the substrate on which the first catch pad 416 is situated.

Figure 6:
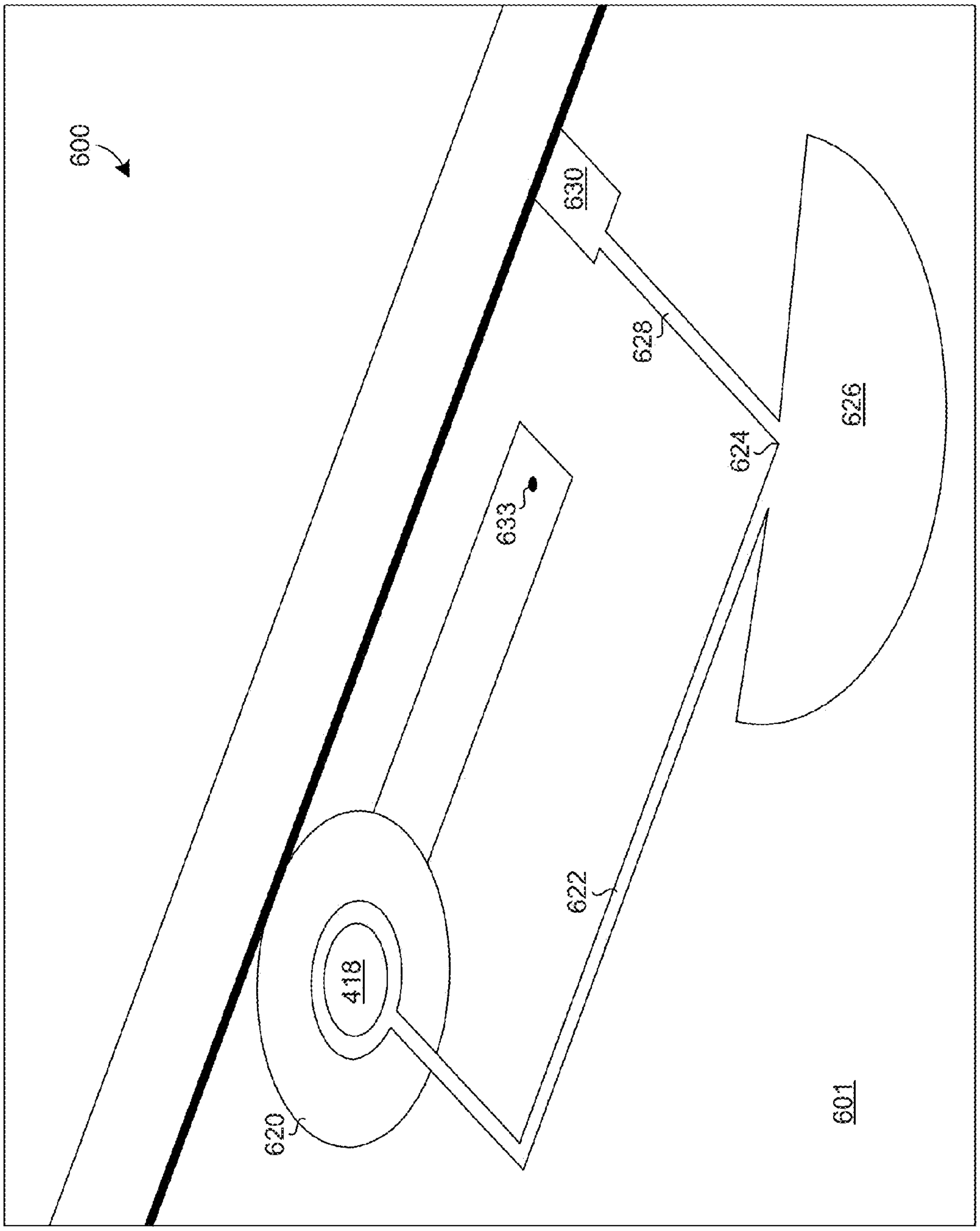
FIG. 6 illustrates a third view of the example circuit or system illustrated in FIGS. 4 and 5.

FIG. 6 illustrates a third view 600 of the example circuit or system illustrated in FIGS. 4 and 5 as viewed on the opposite side of the substrate, e.g., the bottom layer or surface 601. This view 600 illustrates a second catch pad 620, such as the second catch pad 320 of FIG. 3, coupled with the connecting pin 418 of FIGS. 4 and 5. An inductor 622, such as the inductor 322 of FIG. 3, is electrically coupled with a radial stub 626, such as the radial stub 326 of FIG. 3, and also with a DC port 630 by way of a line 628, such as the DC port 330 and line 328 of FIG. 3, respectively. A high impedance line thus provides a connection from the via to the radial stub 626 before the low frequency signal exits the area. This view 600 also illustrates a ground opening 633 to increase the inductance of the second wire 414 of FIG. 4.

Figure 7:
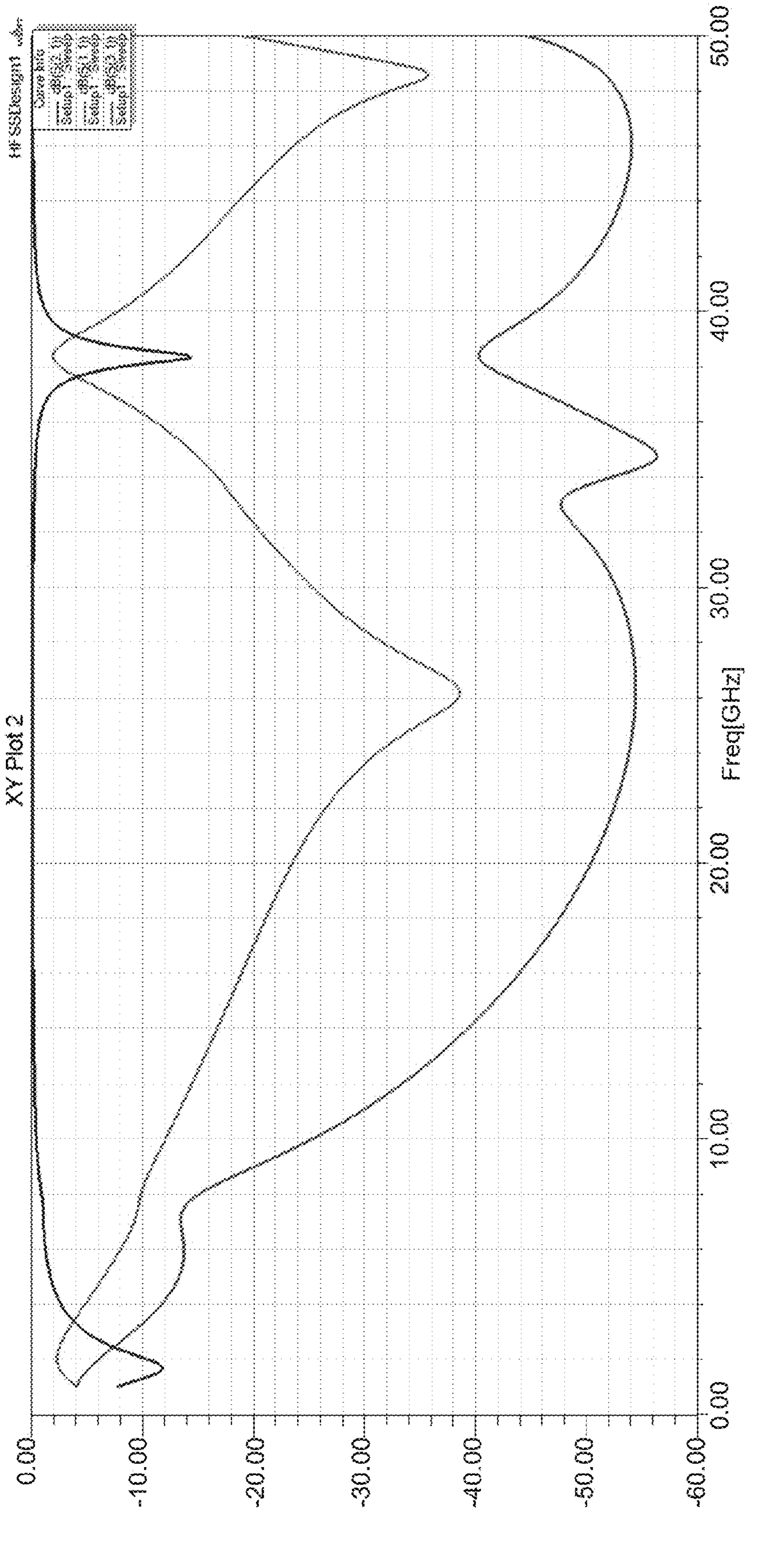
FIG. 7 illustrates an example graph indicating that embodiments of the disclosed technology may provide excellent in-band match as well as low loss and high isolation.

FIG. 7 illustrates an example graph 700 indicating that embodiments of the disclosed technology may provide excellent in-band match as well as low loss and high isolation. Certain embodiments, in which the design goal of a bias tee may be in a range of 24-27 GHz, typically exceed 30 dB of return loss and provide in excess of 50 dB of isolation from the microwave signal. The frequency band may be changed by changing the length of the high-impedance microstrip inductor line, such as the second wire 414 of FIGS. 4 and 5. These features are generally superior to those resulting from current efforts.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A system, comprising:

a substrate having a top layer, a bottom layer, and at least one internal layer;

a first radio frequency (RF) port;

a second RF port electrically coupled with the first RF port;

an RF microstrip integrated with the top layer of the substrate, wherein the RF microstrip couples the first and second RF ports;

a direct current (DC) port; and a bias tee incorporated into the substrate, the bias tee comprising:

a first capacitor comprising a first catch pad integrated with the top layer of the substrate, wherein the first catch pad is electrically coupled with the first and second RF ports;

a second capacitor comprising a second catch pad integrated with the bottom layer of the substrate;

a connecting pin passing through the at least one internal layer of the substrate, wherein the connecting pin is electrically coupled between the first catch pad and the second catch pad; and an inductor at least partially integrated with the bottom layer of the substrate, wherein the inductor is electrically coupled between the second catch pad and the DC port.

2. The system of claim 1, wherein the first RF port is configured to provide an output RF/DC signal.

3. The system of claim 1, wherein the second RF port is configured to provide an input RF signal.

4. The system of claim 1, wherein the DC port is configured to provide an input DC signal.

5. The system of claim 1, further comprising a radial stub electrically coupled between the first inductor and the DC port.

6. The system of claim 5, further comprising a tee providing the electrical coupling between the radial stub and the inductor and DC port.

7. The system of claim 1, wherein the RF microstrip provides the electrical coupling between the first catch pad and the first and second RF ports.

8. The system of claim 1, further comprising a tee providing the electrical coupling between the first catch pad and the first and second RF ports.

9. The system of claim 1, wherein the inductor comprises a first wire electrically coupled between the first catch pad and the first and second RF ports.

10. The system of claim 9, wherein the first wire comprises a bond wire.

11. The system of claim 9, wherein the inductor further comprises a second wire electrically coupled between the first catch pad and the first and second RF ports.

12. The system of claim 11, wherein the second wire is a printed wire that is fully integrated with the top layer of the substrate.

13. The system of claim 11, further comprising a connection point electrically coupling the first and second wires.

14. The system of claim 12, further comprising a window in a ground plane below the printed wire to increase an inductance of the printed wire.

15. The system of claim 1, wherein the first catch pad is situated at a first surface of a substrate and the second catch pad is situated at a second surface of the substrate.

16. The system of claim 15, wherein the connecting pin passes through a via in the substrate.

17. A bias tee incorporated into a multi-layer substrate and configured to couple with each of a first radio frequency (RF) port, a second RF port electrically coupled with the first RF port by way of an RF microstrip, and a direct current (DC) port, the bias tee comprising:

a first capacitor comprising a first catch pad integrated with a top layer of the substrate, wherein the first catch pad is electrically coupled with the first and second RF ports;

a second capacitor comprising a second catch pad integrated with a bottom layer of the substrate;

a connecting pin passing through at least one internal layer of the substrate, wherein the connecting pin is electrically coupled between the first catch pad and the second catch pad; and an inductor electrically coupled between the second catch pad and the DC port, the inductor comprising:

a printed wire integrated with the bottom layer of the substrate; and a bond wire coupled to the RF microstrip.

18. The bias tee of claim 17, further comprising a radial stub electrically coupled between the inductor and the DC port.

19. The bias tee of claim 17, further comprising an opening to ground underneath the printed wire to increase the inductance of the printed wire.

20. The bias tee of claim 17, further comprising additional capacitors, inductors, or both integrated with at least one of the top, bottom, and internal layers of the substrate.

* * * * *